(12) United States Patent
Min et al.

(10) Patent No.: US 8,183,576 B2
(45) Date of Patent: May 22, 2012

(54) LIGHT-EMITTING DIODES INCLUDING PERPENDICULAR-EXTENDING NANO-RODS

(75) Inventors: Bokki Min, Suwon-si (KR); Youngsoo Park, Yongin-si (KR); Taek Kim, Seongnam-si (KR); Junyoun Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 177 days.

(21) Appl. No.: 12/385,611

(22) Filed: Apr. 14, 2009

(65) Prior Publication Data

US 2010/0051986 A1 Mar. 4, 2010

(30) Foreign Application Priority Data

Sep. 4, 2008 (KR) .................. 10-2008-0087439

(51) Int. Cl.
*H01L 31/00* (2006.01)
*H01L 27/15* (2006.01)
*H01L 31/12* (2006.01)
*H01L 33/00* (2006.01)

(52) U.S. Cl. ....... 257/79; 257/13; 257/98; 257/E33.055; 257/E33.064; 257/E33.072; 977/720; 977/721; 977/722; 977/723; 977/932

(58) Field of Classification Search .............. 257/13, 257/79, 98, E33.055, E33.064, E33.072; 977/720, 721, 722, 723, 932
See application file for complete search history.

(56) References Cited

U.S. PATENT DOCUMENTS

| | | | | |
|---|---|---|---|---|
| 5,332,910 A * | 7/1994 | Haraguchi et al. | ............... | 257/13 |
| 7,056,446 B2 * | 6/2006 | Nagase et al. | .................. | 216/57 |
| 7,132,677 B2 * | 11/2006 | Kim et al. | ......................... | 257/14 |
| 7,294,862 B2 * | 11/2007 | Wierer et al. | .................... | 257/94 |
| 7,400,665 B2 * | 7/2008 | Wang et al. | .............. | 372/50.124 |
| 7,545,051 B2 * | 6/2009 | Yang et al. | ..................... | 257/784 |
| 7,635,905 B2 * | 12/2009 | Kim, II | ...................... | 257/432 |
| 7,675,071 B2 * | 3/2010 | Moon et al. | ..................... | 257/79 |
| 7,728,333 B2 * | 6/2010 | Kastalsky | ........................ | 257/72 |
| 7,781,778 B2 * | 8/2010 | Moon et al. | ..................... | 257/79 |
| 7,825,032 B2 * | 11/2010 | Bakkers et al. | ............... | 438/707 |
| 7,834,344 B2 * | 11/2010 | Mascolo et al. | ................ | 257/28 |
| 8,022,432 B2 * | 9/2011 | Yi et al. | .......................... | 257/99 |
| 2005/0006754 A1 * | 1/2005 | Arik et al. | ..................... | 257/712 |
| 2005/0082543 A1 * | 4/2005 | Alizadeh et al. | ................. | 257/79 |
| 2005/0161662 A1 * | 7/2005 | Majumdar et al. | .............. | 257/18 |
| 2006/0223211 A1 * | 10/2006 | Mishra et al. | .................... | 438/41 |
| 2007/0034857 A1 | 2/2007 | Song | ................................ | 257/13 |

(Continued)

FOREIGN PATENT DOCUMENTS

JP 2007-043045 A 2/2007

(Continued)

*Primary Examiner* — Ida M Soward

(74) *Attorney, Agent, or Firm* — Harness, Dickey & Pierce, P.L.C.

(57) ABSTRACT

Light-emitting diodes, and methods of manufacturing the light-emitting diode, are provided wherein a plurality of nano-rods may be formed on a reflection electrode. The plurality of nano-rods extend perpendicularly from an upper surface of the reflection electrode. Each of the nano-rods includes a first region doped with a first type dopant, a second region doped with a second type dopant that is an opposite type to the first type dopant, and an active region between the first region and the second region. A transparent insulating layer may be formed between the plurality of nano-rods. A transparent electrode may be formed on the plurality of nano-rods and the transparent insulating layer.

10 Claims, 5 Drawing Sheets

U.S. PATENT DOCUMENTS

| | | | |
|---|---|---|---|
| 2007/0126013 A1* | 6/2007 | Kim et al. | 257/91 |
| 2007/0248132 A1* | 10/2007 | Kikuchi et al. | 372/44.01 |
| 2007/0252132 A1* | 11/2007 | Kamins et al. | 257/13 |
| 2008/0105296 A1* | 5/2008 | Samuelson et al. | 136/255 |
| 2008/0157057 A1* | 7/2008 | Kim | 257/13 |
| 2008/0237858 A1* | 10/2008 | Nihei | 257/746 |
| 2008/0305568 A1* | 12/2008 | Huang et al. | 438/34 |
| 2008/0315229 A1* | 12/2008 | Yi et al. | 257/98 |
| 2009/0061149 A1* | 3/2009 | Shin et al. | 428/119 |
| 2009/0072706 A1* | 3/2009 | Feng et al. | 313/496 |
| 2009/0079034 A1* | 3/2009 | Wang | 257/615 |
| 2009/0145477 A1* | 6/2009 | Moon et al. | 136/256 |
| 2009/0179192 A1* | 7/2009 | Kamins | 257/14 |
| 2009/0242869 A1* | 10/2009 | Hovel et al. | 257/13 |
| 2010/0025673 A1* | 2/2010 | Hu et al. | 257/43 |
| 2012/0000525 A1* | 1/2012 | Flood | 136/256 |

FOREIGN PATENT DOCUMENTS

| | | |
|---|---|---|
| JP | 2007-049159 A | 2/2007 |
| KR | 1020040056441 A | 7/2004 |
| KR | 1020050081139 A | 8/2005 |
| KR | 1020080030042 A | 4/2008 |
| KR | 1020080035578 A | 4/2008 |

* cited by examiner

LIGHT-EMITTING DIODES INCLUDING PERPENDICULAR-EXTENDING NANO-RODS

CROSS-REFERENCE TO RELATED APPLICATIONS

This application claims the benefit of priority under 35 U.S.C. §119 from Korean Patent Application No. 10-2008-0087439, filed on Sep. 4, 2008, in the Korean Intellectual Property Office, the disclosure of which is incorporated herein in its entirety by reference.

BACKGROUND

1. Field

Example embodiments relate to light-emitting diodes using nano-rods. Other example embodiments relate to methods of manufacturing a light emitting diode.

2. Description of the Related Art

A light-emitting diode (LED) that uses a semiconductor has high efficiency. A LED is also an environmentally friendly source of light. Light-emitting devices are widely used in various fields (e.g., displays, optical communications, automobiles, common illuminations, etc.).

An LED technique for general illumination has been the focus of recent research due to the development of a white light LED technique. The white light LED may be produced using, for example, a blue LED or an ultraviolet-ray LED with a phosphor material. The white light LED may be produced by combining red, green, and blue LEDs.

The blue or ultraviolet-ray LED, which is a main constituent of the white light LED, may be formed mainly using a gallium nitride (GaN) compound semiconductor. The GaN compound semiconductor has a wide band gap. Thus, light almost having a wavelength region from visible light to ultraviolet rays may be obtained according to the composition of the nitride compound. Conventionally, a thin-film GaN LED may be formed by growing a GaN thin film on a sapphire ($Al_2O_3$) substrate. If the GaN compound semiconductor is grown as a thin film on a sapphire ($Al_2O_3$) substrate, the emission efficiency of light is reduced due to the mismatch of the lattice constant, or the thermal expansion coefficient, of the thin film GaN LED. Also, the manufacturing costs increase due to the difficultly in growing the GaN compound semiconductor in a larger size area.

In order to address the above drawbacks, techniques for forming nano-scale LEDs have been researched wherein the thin film GaN LED is formed in a bar shape with a p-n junction using a GaN compound semiconductor, or zinc oxide. In the case of a LED formed by arranging a plurality of nano-rods, growth in a larger area is possible because the mismatch of the lattice constant or the thermal expansion coefficient difference of the LED is mitigated due to the structural characteristics of the nano-rods that are separated from each other. The nano-rod arrangement structure may have a substantially high light extraction efficiency because the nano-rod arrangement structure has a substantially low average refraction rate due to spaces between the nano-rods, and due to the structural characteristics that disperse light. In the case of a LED that includes nano-rods, it is difficult to supply a substantially uniform current to each of the nano-rods. Also, the method of growing the nano-rods may be inefficient.

SUMMARY

Example embodiments relate to light-emitting diodes using nano-rods. Other example embodiments relate to methods of manufacturing a light emitting diode.

Example embodiments relate to a light-emitting diode including nano-rods having a structure that may be efficiently grown and that allow a current to be more uniformly supplied to each of the nano-rods. Other example embodiments relate to a method of manufacturing a light-emitting diode that includes nano-rods.

Additional aspects will be set forth in the description which follows and will be apparent from the description, or may be learned by practice of example embodiments.

To achieve the above and/or other aspects, example embodiments may include a light-emitting diode including a supporting substrate, a reflection electrode disposed on the supporting substrate, a plurality of nano-rods perpendicularly disposed on the reflection electrode, a transparent insulating layer formed between the nano-rods, and a transparent electrode disposed on the nano-rods and the transparent insulating layer. Each nano-rod includes a first region doped with a first type dopant, a second region doped with a second type dopant that is an opposite type to the first type dopant, and an active region formed between the first region and the second region.

The supporting substrate may have electrical conductivity. The supporting substrate may be selected from the group consisting of a highly-doped silicon (Si) substrate, a highly-doped germanium (Ge) substrate, a highlydoped compound semiconductor substrate and a metal substrate.

The light-emitting diode may include an auxiliary formed on the transparent electrode. The auxiliary electrode may have a desired pattern. The auxiliary electrode may be formed of a highly conductive material selected from the group consisting of silver (Ag), aluminum (Al), copper (Cu), gold (Au) and combinations thereof.

The reflection electrode may be formed of silver (Ag), aluminum (Al) or a silver aluminum alloy.

The transparent insulating layer may be formed of a silicon oxide (e.g., $SiO_2$), silicon resin or epoxy resin.

The transparent electrode may be formed of a transparent conductive oxide that includes at least one of indium tin oxide (ITO), aluminum zinc oxide (AZO), indium zinc oxide (IZO) or combinations thereof.

Circumferential surfaces of the nano-rods, except for a bottom surface of the nano-rods that electrically contact the reflection electrode and a top surface of the nano-rods that electrically contact the transparent electrode, may be passivated.

The light-emitting diode may include an epitaxy layer formed of the same material used to form the nano-rods. The epitaxy layer may be formed between the transparent electrode and the nano-rods. The epitaxy layer may be doped with the second type dopant, which is the same dopant used in the second region.

To achieve the above and/or other aspects, example embodiments include a method of manufacturing a light-emitting diode including vertically growing a plurality of nano-rods, filling gaps between the nano-rods with a transparent insulating layer, forming a reflection electrode on the nano-rods and the transparent insulating layer to electrically contact the nano-rods, forming a supporting substrate on the reflection electrode, removing the growth substrate and forming a transparent electrode on a position where the growth substrate is removed. The transparent electrode may electrically contact the nano-rods. Each nano-rod includes a first region doped with a first type dopant, a second region doped with a second type dopant that is an opposite type to the first type dopant, and an active region formed between the first region and the second region on a growth substrate.

Prior to vertically growing the nano-rods, an epitaxy layer may be formed on an entire surface of the growth substrate. The nano-rods may be grown on the epitaxy layer. The epitaxy layer may be formed of the same material used to form the nano-rods After growing the nano-rods, circumferential surfaces of the nano-rods may be passivated.

The method may include forming an auxiliary electrode, having a desired pattern, on a surface of the transparent electrode.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIG. 1 is a schematic cross-sectional view of the structure of a light-emitting diode that includes nano-rods according to example embodiments;

FIG. 2 is plan view showing an pattern structure of an auxiliary electrode of the light-emitting diode that includes nano-rods according to example embodiments;

FIG. 3 is a schematic cross-sectional view showing a current spreading path in the light-emitting diode that includes nano-rods according to example embodiments;

FIG. 4 is a schematic cross-sectional view showing an light extraction path in the light-emitting diode that includes nano-rods according to example embodiments;

FIG. 6 is a schematic cross-sectional view of the structure of a light-emitting diode that includes nano-rods according to example embodiments.

DETAILED DESCRIPTION

Figure 1:
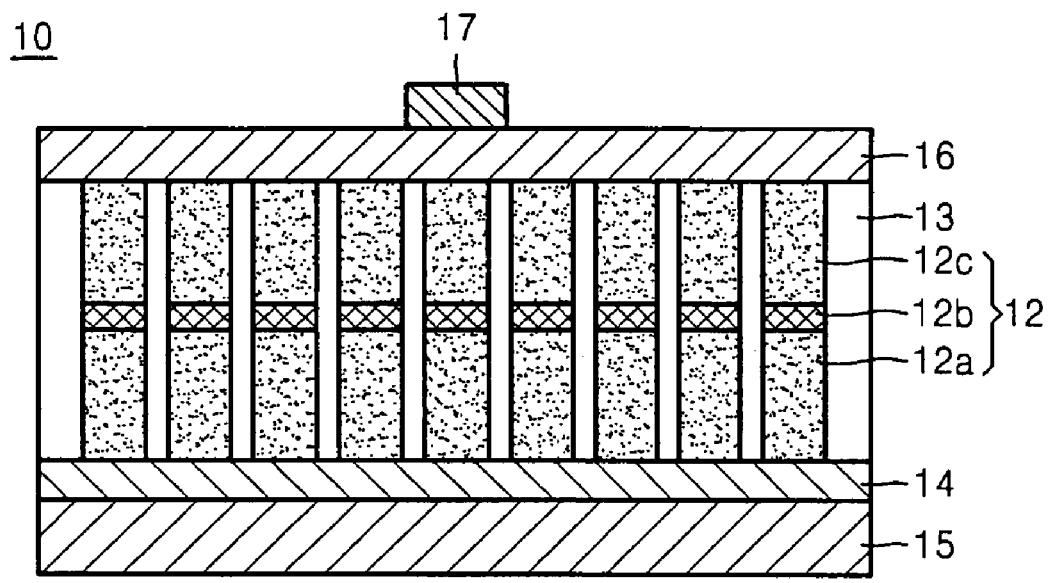

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to light-emitting diodes using nano-rods. Other example embodiments relate to methods of manufacturing a light emitting diode.

FIG. 1 is a schematic cross-sectional view of the structure of a light-emitting diode that includes a plurality of nano-rods according to examples embodiments.

Referring to FIG. 1, a light-emitting diode 10 may include a supporting substrate 15, a reflection electrode 14 disposed on the supporting substrate 15, a plurality of nano-rods 12 perpendicularly disposed on the reflection electrode 14, a transparent insulating layer 13 formed between the nano-rods 12, and a transparent electrode 16 disposed on the nano-rods 12 and the transparent insulating layer 13. The nano-rods 12 may be extend substantially perpendicular to an upper surface of the reflection electrode 14. The transparent insulating layer 13 may be between the transparent electrode 16 and the reflection electrode 14.

The supporting substrate 15 may have a thickness sufficient to support the entire structure of the light-emitting diode 10 including the reflection electrode 14 and the nano-rods 12. For example, the supporting substrate 15 may have a thickness of a few tens to hundreds of μm. The supporting substrate 15 may have electrical conductivity. If the supporting substrate 15 has electrical conductivity, an electrode pad of a package block may be directly electrically connected to the supporting substrate 15 when, for example, the light-emitting diode 10 is packaged. The supporting substrate 15 may be a highly-doped silicon (Si) substrate, a highly-doped germanium (Ge) substrate, a highly-doped compound semiconductor substrate, or a metal substrate. The supporting substrate 15 may be formed of a conductive metal having high thermal conductivity (e.g., copper (Cu)) in order that heat generated from the nano-rods can dissipate.

The reflection electrode 14 reflects light generated from the nano-rods 12 upwards. The reflection electrode 14 may be formed of a metal having a substantially high reflective index (e.g., silver (Ag), aluminum (Al) or a silver/aluminum alloy.

The nano-rods 12 have a light emission structure formed with a p-n junction in order that light may be emitted. As depicted in FIG. 1, the nano-rods 12 each include a first region 12a doped with a first type dopant, a second region 12c doped with a second type dopant that is an opposite type to the first type dopant, and an active region 12b between the first region 12a and the second region 12c. The first region 12a may be doped with a p-type dopant and the second region 12c may be doped with an n-type dopant. Alternatively, the first region 12a may be doped with an n-type dopant and the second region 12c may be doped with a p-type dopant.

According to the example embodiments, the nano-rods 12 may be formed of a GaN— or ZnO-based semiconductor material. For example, if the nano-rods 12 are formed of a GaN-based semiconductor material, the first region 12a may be formed of p-type $Al_xGa_yIn_zN$ (wherein x+y+z=1), and the second region 12c may be formed of n-type $Al_xGa_yIn_zN$ (wherein x+y+z=1). The active region 12b may be formed in a single, or a multi, quantum well structure formed by controlling a band gap obtained from periodically changing the value of x, y, and z in $Al_xGa_yIn_zN$. If the nano-rods 12 are formed of a ZnO-based semiconductor material, the first region 12a may be formed of p-type $Mg_xZn_yO$ (wherein x+y=1), and the second region 12c may be formed of n-type MgxZnyO (wherein x+y=1). The active region 12b may be formed in a single, or a multi, quantum well structure formed by controlling a band gap obtained from periodically changing the value of x and y, in n-type $Mg_xZn_yO$.

Although it will be described later, according to example embodiments, the nano-rods 12 may not be directly grown on the reflection electrode 14. The nano-rods 12 may be grown on an appropriate substrate, and subsequently the substrate may be removed. As such, a substantially high quality nano-rods 12 may be more effectively grown. The substrate for growing the nano-rods 12 may be selected from various substrates (e.g., a semiconductor substrate formed of silicon (Si), germanium (Ge), gallium arsenic (GaAs), or gallium phosphorus (GaP), a sapphire substrate, or a glass substrate). The nano-rods 12 may be grown by various methods (e.g., a metal-organic vapor phase epitaxy (MOVPE) method, a molecular-beam-epitaxy (MBE) method, or a Vapor-Liquid-Solid (VLS) method that uses nano-particles of a metal (e.g., iron (Fe), gold (Au), or nickel (Ni)) as a growing catalyst).

Surfaces of the nano-rods 12 grown by the above methods may be passivated, except for bottom surfaces of the nano-rods 12 that electrically contact the reflection electrode 14 and top surfaces of the nano-rods 12 that electrically contact the transparent electrode 16. If the surfaces of the nano-rods 12 are not passivated, a current supplied to the nano-rods 12 through the reflection electrode 14 and the transparent electrode 16 may leak through the surfaces of the nano-rods 12, reducing the light emission efficiency of the light-emitting diode 10. The passivation of the nano-rods 12 may protect the nano-rods 12 from electrical and/or chemical impact.

The transparent insulating layer 13 formed between the nano-rods 12 electrically insulates the nano-rods 12. The transparent insulating layer 13 may mechanically protect the nano-rods 12. The transparent insulating layer 13 may be formed of an oxide (e.g., $SiO_2$) or a transparent insulating resin (e.g., a silicon resin or an epoxy resin).

The transparent electrode 16 disposed on the nano-rods 12 and the transparent insulating layer 13 may be formed of a transparent conductive oxide (TCO) (e.g., indium tin oxide (ITO), aluminum zinc oxide (AZO), or indium zinc oxide (IZO)), or a thin nickel/gold (Ni/Au) layer. According to example embodiments, the transparent electrode 16 may function as a current spreading layer. More uniformly spreading the current enables a more uniform current supply to the nano-rods 12. As the area of the light-emitting diode chip increases, it is desirable to more uniformly spread the current. In order to obtain a desirable current spreading effect, the transparent electrode 16 needs to be relatively thick. Optical absorption increases as the thickness of the transparent electrode 16 increases, reducing light extraction efficiency. In order to determine the thickness of the transparent electrode 16, it may be necessary to balance the uniform current spreading effect and the reduction of the light extraction efficiency. If the transparent electrode 16 is formed of TCO, the transparent electrode 16 may have a thickness of about 0.1-μm to about 1-μm.

According to example embodiments, as depicted in FIG.1, an auxiliary electrode 17 having a relatively high electrical conductivity may be formed on the transparent electrode 16 in order to more uniformly spread the current. The auxiliary electrode 17 may be formed of a highly conductive metal (e.g., silver (Ag), aluminum (Al), copper (Cu), or gold (Au)). According to example embodiments, the auxiliary electrode 17 may be formed with a desired pattern (e.g., a pattern of a mesh structure) on a surface of the transparent electrode 16.

Figure 2:
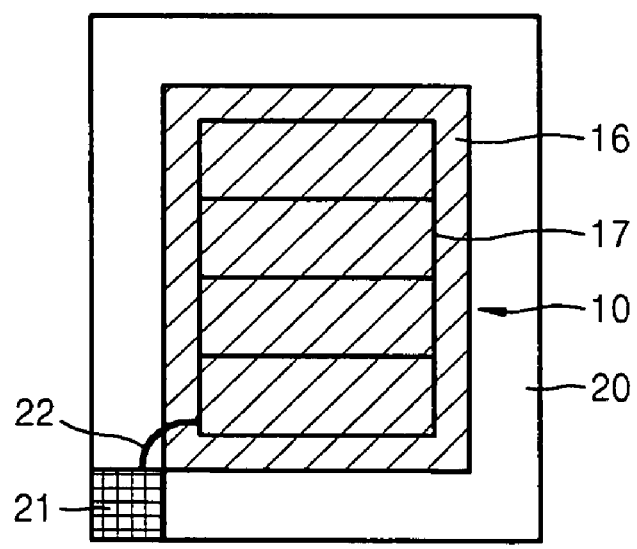

FIG. 2 is a plan view showing a pattern structure of the auxiliary electrode according to example embodiments.

Referring to FIG. 2, the light-emitting diode 10 is fixed on a package block 20. The auxiliary electrode 17, having a pattern formed of a plurality of parallel wires, is formed on the transparent electrode 16. The auxiliary electrode 17 may be electrically connected to a bonding pad 21 formed on the package block 20 via wire 22.

Figure 3:
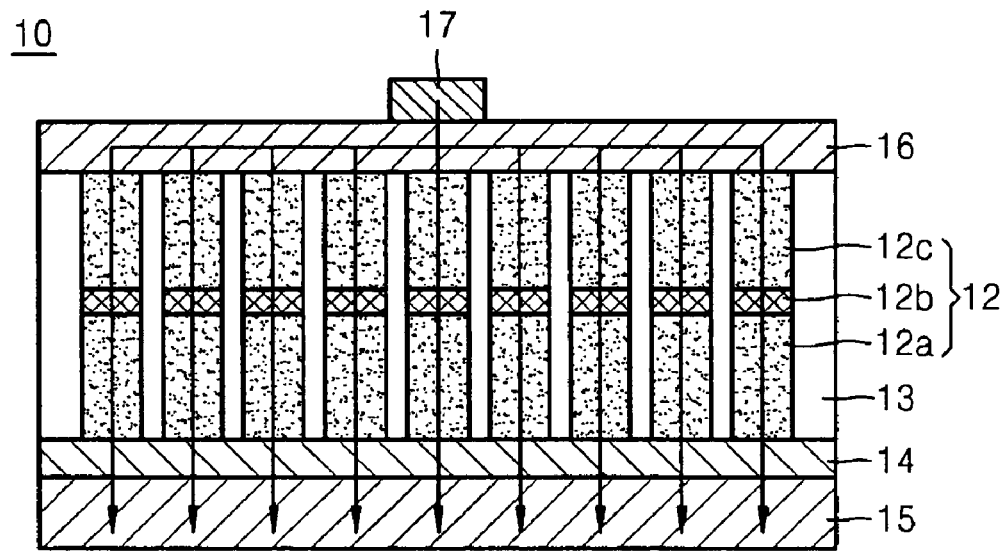

FIG. 3 is a schematic cross-sectional view showing a current spreading path in the light-emitting diode shown in FIG. 1 that includes nano-rods according to example embodiments.

Referring to FIG. 3, a current supplied to the light-emitting diode 10 spreads in a horizontal direction in the transparent electrode 16, which functions as a current spreading layer. Subsequently, the current may be uniformly applied to all of the nano-rods 12, and the nano-rods 12 more uniformly emit light. The more uniform emission of light by the nano-rods 12 may be particularly important in a high output light-emitting diode structure having a substantially large emission area.

Figure 4:
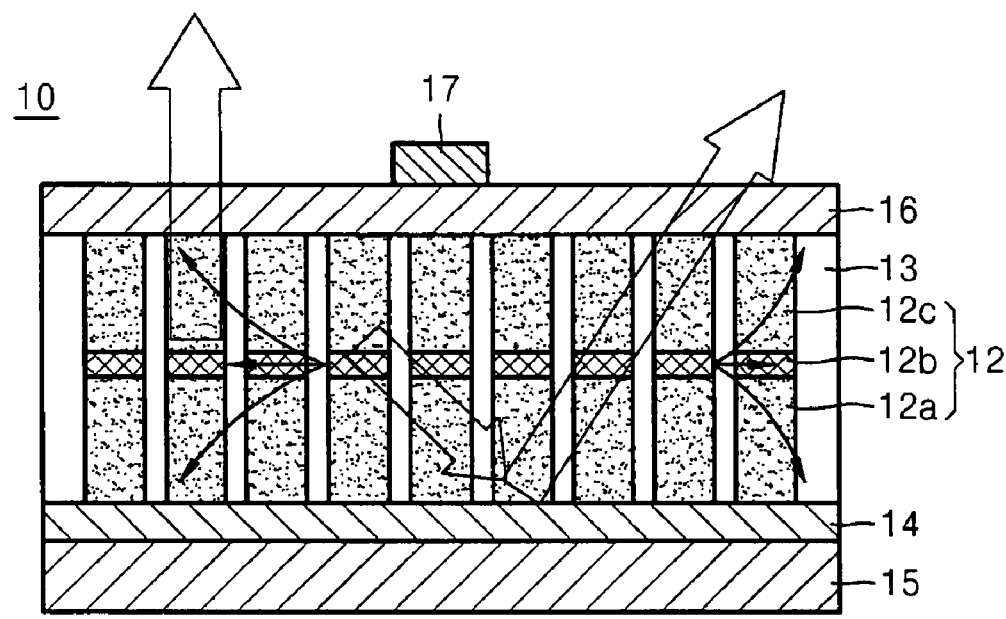

FIG. 4 is a schematic cross-sectional view showing a light extraction path in the light-emitting diode that includes nano-rods according to example embodiments.

Referring to FIG. 4, if a current is supplied to the nano-rods 12 through the reflection electrode 14 and the transparent electrode 16, light is generated in the active regions 12b of the nano-rods 12. The emission of light from the active region 12b may be a spontaneous emission, causing light to be emitted in all directions because there is no (or lower) directionality. The light emitted upwards may be directly extracted to the outside through the transparent electrode 16. The light emitted downwards may be extracted to the outside through the transparent electrode 16 after reflecting off the reflection electrode 14.

Light emitted in a lateral direction of the light-emitting diode 10 undergoes the repeated variation of refractive index while passing through the nano-rods 12 and the transparent insulating layer 13. During this process, light is gradually emitted upwards and downwards while dispersing. Due to the repeated light dispersion caused by the refraction index variation, a portion of the dispersed light may be directly extracted to the outside through the transparent electrode 16 and another portion of the dispersed light may be extracted to the outside through the transparent electrode 16 after reflecting off the reflection electrode 14. As such, the light-emitting diode 10 may have a higher light extraction efficiency due to the dispersing effect generated by the nano-rods 12 and the transparent insulating layer 13. The dispersing effect may be more important in a substantially large area and a high output light-emitting diode structure. If the height of the nano-rods 12 is short, the optical path of light dispersed in the light-emitting diode 10 is reduced (i.e., the optical path the light travels prior to being extracted-to the outside of the light-emitting diode 10). As such, the optical absorption rate of the light-emitting diode 10 may decrease. For example, the nano-rods 12 may have a height of about 0.3 μm to about 5 μm.

A method of manufacturing the nano-rods according to example embodiments will be described in detail with reference to FIGS. 5A through 5F.

FIGS. 5A through 5F are schematic cross-sectional views of a method of manufacturing the light-emitting diode that includes nano-rods according to example embodiments.

Figure 5A:
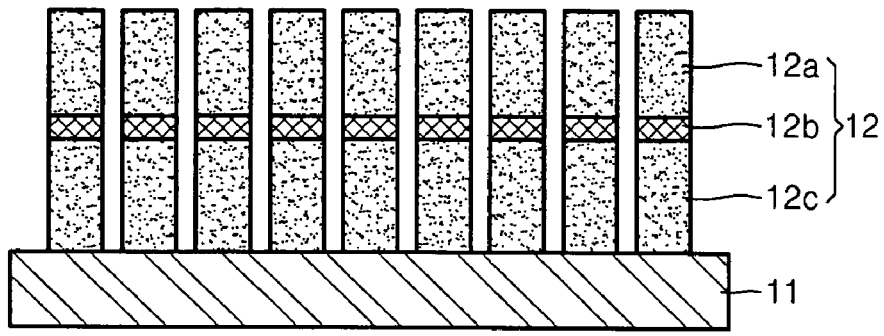
FIGS. 5A through 5F are schematic cross-sectional views of a method of manufacturing a light-emitting diode that includes nano-rods according to example embodiments.

Referring to FIG. 5A, a plurality of nano-rods 12 are vertically grown on a growth substrate 11. The nano-rods 12 may be grown by a metal-organic vapor phase epitaxy (MOVPE) method, a molecular-beam-epitaxy (MBE) method, or a Vapor-Liquid-Solid (VLS) method. The growth substrate 11 may be a substrate formed of silicon (Si), germanium (Ge), gallium arsenic (GaAs), gallium phosphorus (GaP), sapphire or glass. The growth substrate 11 may be formed by selecting an appropriate material upon consideration of the material that will be used to grow the nano-rods 12. Regions of the nano-rods 12 may be grown in an opposite direction to the sequential direction of the nano-rods 12 depicted in FIG. 1. That is, the second region 12c doped with the second type dopant, the active region 12b and the first region 12a doped with the first type dopant may be sequentially grown on the growth substrate 11. Although not shown, when the growth of the nano-rods 12 is completed, surfaces of the nano-rods 12 (in particular, circumferential surfaces of the nano-rods 12) are passivated using an oxidation method.

Figure 5B:
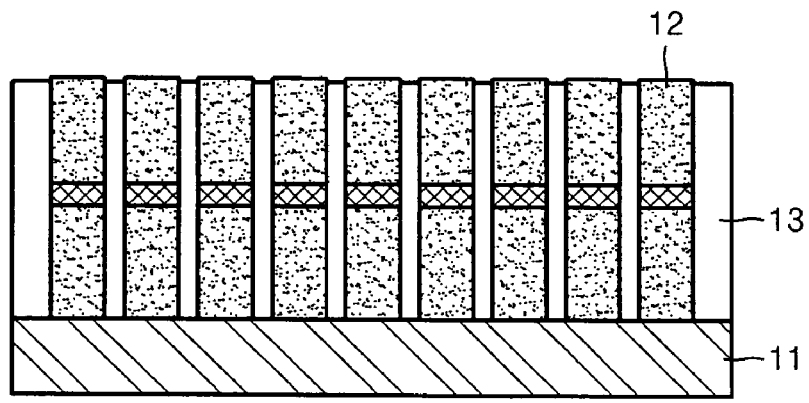

Referring to FIG. 5B, a transparent insulating layer 13 is formed on the growth substrate 11 on which the nano-rods 12 are formed using a transparent insulating material (e.g., $SiO_2$, silicon resin, or epoxy resin). The transparent insulating layer 13 is formed between the nano-rods 12. The transparent insulating layer 13 may be formed between the nano-rods 12 by a Sol-Gel process.

Top surfaces of the nano-rods 12 to be electrically connected to an electrode may be cleaned using an etching process or a chemical mechanical polishing process, and subsequently exposed.

Figure 5C:
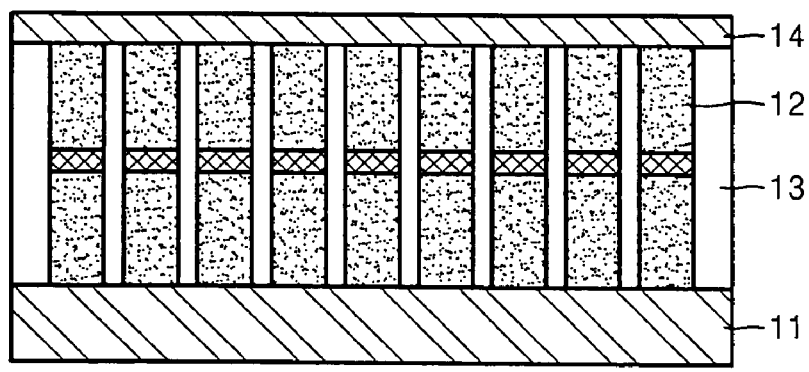

Referring to FIG. 5C, a reflection electrode 14 may be formed on the nano-rods 12 and the transparent insulating layer 13. The reflection electrode 14 forms an electrical ohmic contact with the nano-rods 12. The reflection electrode 14 may also have a substantially high reflexibility. The reflection electrode 14 may be formed of silver (Ag), aluminum (Al) or an alloy that contains Ag or Al.

Figure 5D:
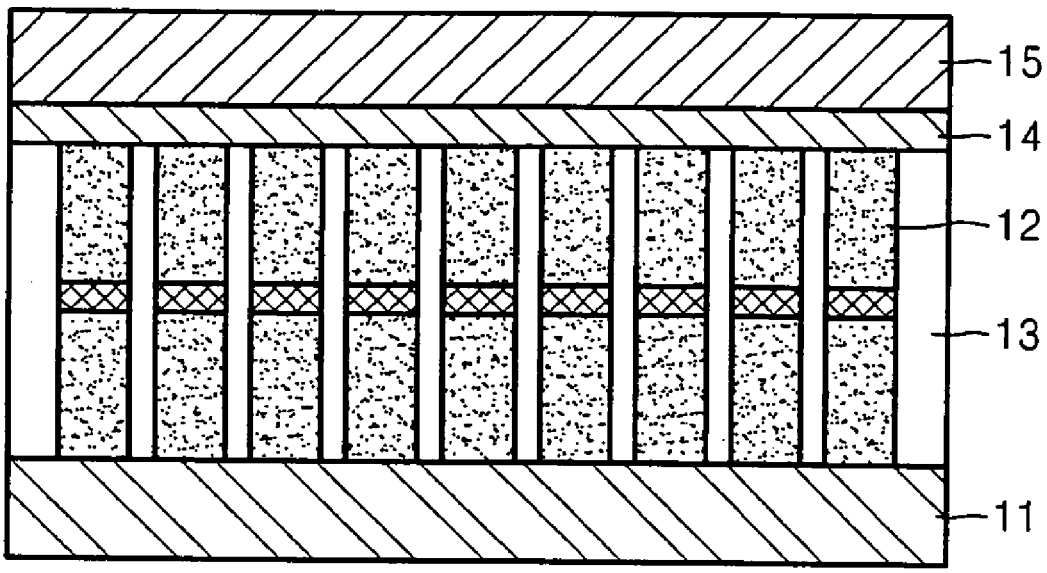

Referring to FIG. 5D, a conductive supporting substrate 15 may be attached to the reflection electrode 14 using a wafer bonding process or a plating process. As described above, the conductive supporting substrate 15 may be a highly-doped Si substrate, a highly-doped Ge substrate, a highly-doped compound semiconductor substrate or a metal substrate. Although it is not depicted, an electrode pad for packaging the light-emitting diode 10 in a subsequent process may be formed.

Figure 5E:
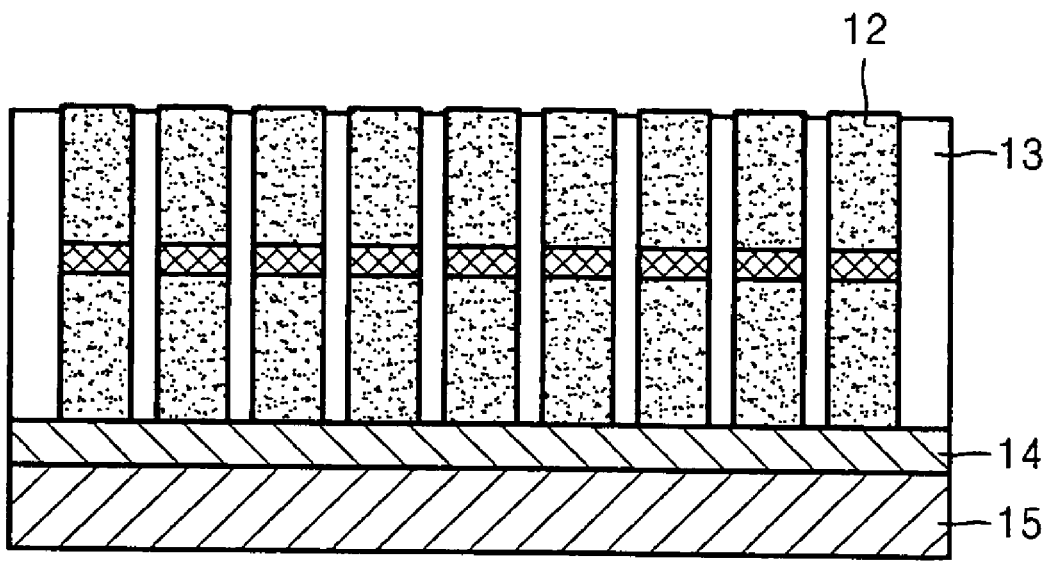

Referring to FIG. 5E, the structure is turned upside down so that the growth substrate 11 faces upwards. Subsequently, the growth substrate 11 is removed using a CMP process or an etching process. The growth substrate 11 may be removed using a chemical lift-off (CLO) method that separates the growth substrate 11 based on a chemical reaction that occurs on the interface between the growth substrate 11 and the nano-rods 12, or a laser lift-off (LLO) method that separates the growth substrate 11 by irradiating a high energy laser on an interface between the growth substrate 11 and the nano-rods 12.

Figure 5F:
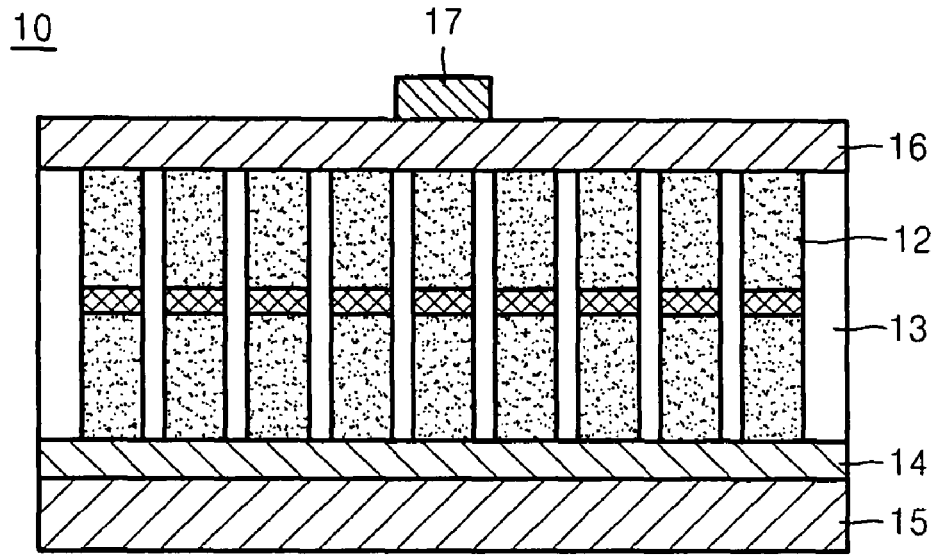

Referring to FIG. 5F, the transparent electrode 16 may be formed on the same position from where the growth substrate 11 was removed. The auxiliary electrode 17 may be formed on the transparent electrode 16.

Figure 6:
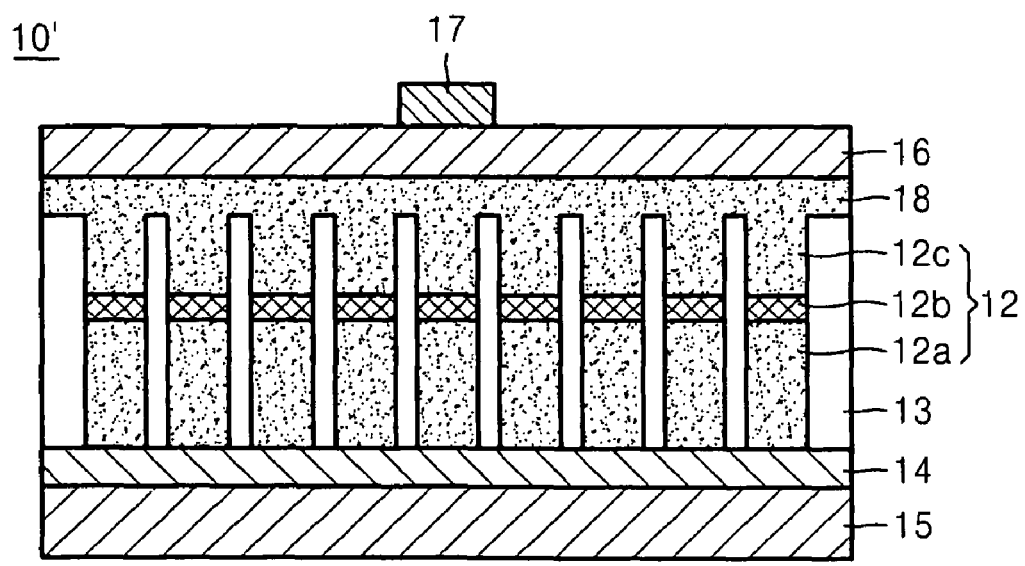

FIG. 6 is a schematic cross-sectional view of the structure of a light-emitting diode that includes the nano-rods according to example embodiments.

Referring to FIG. 6, a light-emitting diode 10' according to example embodiments may include an epitaxy layer 18 under a transparent electrode 16. The epitaxy layer 18 is interposed between a plurality of nano-rods 12 and the transparent electrode 16. The epitaxy layer 18 may be formed of the same material used to form the nano-rods 12. The epitaxy layer 18 may be formed during the process of used to grow the nano-rods 12. In particular, the epitaxy layer 18 may be doped with the second type dopant, similar to a second region 12c of the nano-rods 12.

According to example embodiments, the nano-rods 12 may be grown on the epitaxy layer 18, after growing the thin epitaxy layer 18 is grown on the entire surface of the growth substrate 11. Because the nano-rods 12 in the second region 12c are grown on the growth substrate 11 prior to the action region 12b and the first region 12a, the epitaxy layer 18 may be grown and doped with the same dopants as the second region 12c. If the nano-rods 12 are grown on the epitaxy layer 18 after the epitaxy layer 18 is grown, a more stable electrical connection between the transparent electrode 16 and the nano-rods 12 may be achieved if the growth substrate 11 is removed and the transparent electrode 16 is formed on the position where the growth substrate 11 is removed.

In the light-emitting diode 10 of FIG. 1, the nano-rods 12 each having a small cross-section and the transparent electrode 16 form an electrical contact. In the light-emitting diode 10' of FIG. 6, the epitaxy layer 18 having a larger area than the nano-rods 12 forms an electrical contact with the transparent electrode 16. Therefore, the light-emitting diodes according to example embodiments have a more stable electrical connection between the transparent electrode 1 and the nano-rods.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A light-emitting diode, comprising:
   a reflection electrode on a supporting substrate, wherein the supporting substrate has electrical conductivity;
   a plurality of nano-rods on the reflection electrode, the reflection electrode being interposed between the supporting substrate and the plurality of nano-rods, wherein the plurality of nano-rods extend perpendicularly from an upper surface of the reflection electrode, and each of the nano-rods includes a first region doped with a first type dopant, a second region doped with a second type dopant that is an opposite type to the first type dopant, and an active region between the first region and the second region;
   a transparent insulating layer between the plurality of nano-rods;
   a transparent electrode on the plurality of nano-rods and the transparent insulating layer; and
   an epitaxy layer between the transparent electrode and the plurality of nano-rods, wherein the epitaxy layer and the plurality of nano-rods are formed of the same material.

2. The light-emitting diode of claim 1, wherein the supporting substrate is one selected from the group consisting of a highly-doped silicon (Si) substrate, a highly-doped germanium (Ge) substrate, a highly-doped compound semiconductor substrate and a metal substrate.

3. The light-emitting diode of claim 1, further comprising an auxiliary electrode on the transparent electrode, wherein the auxiliary electrode has a pattern.

4. The light-emitting diode of claim 3, wherein the auxiliary electrode is formed of a highly conductive material selected from the group consisting of silver (Ag), aluminum (Al), copper (Cu), gold (Au) and combinations thereof.

5. The light-emitting diode of claim 1, wherein the reflection electrode is formed of silver (Ag), aluminum (Al) or an silver aluminum alloy.

6. The light-emitting diode of claim 1, wherein the transparent insulating layer is formed of silicon dioxide ($SiO_2$), silicon resin or epoxy resin.

7. The light-emitting diode of claim 1, wherein the transparent electrode is formed of a transparent conductive oxide that includes at least one selected from the group consisting of indium tin oxide (ITO), aluminum zinc oxide (AZO), indium zinc oxide (IZO) and combinations thereof.

8. The light-emitting diode of claim 1, wherein circumferential surfaces of the plurality of nano-rods, excluding a bottom surface of the plurality of nano-rods that electrically contacts the reflection electrode and a top surface of the plurality nano-rods that electrically contacts the transparent electrode, are passivated.

9. A light-emitting diode, comprising:
   a reflection electrode on a supporting substrate;
   a plurality of nano-rods on the reflection electrode, wherein the plurality of nano-rods extend perpendicularly from an upper surface of the reflection electrode, and each of the nano-rods includes a first region doped with a first type dopant, a second region doped with a second type dopant that is an opposite type to the first type dopant, and an active region between the first region and the second region;
   a transparent insulating layer between the plurality of nano-rods;
   a transparent electrode on the plurality of nano-rods and the transparent insulating layer; and
   an epitaxy layer between the transparent electrode and the plurality of nano-rods, wherein the epitaxy layer and the plurality of nano-rods are formed of the same material.

10. The light-emitting diode of claim 9, wherein the epitaxy layer is doped with the second type dopant.

* * * * *